US012717990B2

(12) United States Patent
Niramarnkarn et al.

(10) Patent No.: US 12,717,990 B2
(45) Date of Patent: Aug. 25, 2026

(54) SYSTEMS AND METHODS FOR AUTOMATICALLY GENERATING A PRINTED CIRCUIT BOARD DESIGN

(71) Applicants: Advanced Micro Devices, Inc., Santa Clara, CA (US); ATI Technologies ULC, Markham (CA)

(72) Inventors: Supatta Niramarnkarn, Austin, TX (US); Fei Guo, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 843 days.

(21) Appl. No.: 17/954,249

(22) Filed: Sep. 27, 2022

(65) Prior Publication Data

US 2025/0315581 A1 Oct. 9, 2025

(51) Int. Cl.
*G06F 30/323* (2020.01)
*G06F 30/392* (2020.01)

(52) U.S. Cl.
CPC .......... *G06F 30/323* (2020.01); *G06F 30/392* (2020.01)

(58) Field of Classification Search
CPC ............................ G06F 30/323; G06F 30/392
USPC .......................................................... 716/103
See application file for complete search history.

(56) References Cited

U.S. PATENT DOCUMENTS

| | | | | |
|---|---|---|---|---|
| 8,166,447 | B1 * | 4/2012 | Smith | G06F 30/367 716/132 |
| 8,487,430 | B1 * | 7/2013 | Walworth | H01L 25/0657 257/664 |
| 10,231,324 | B2 * | 3/2019 | Lane | H01L 23/5286 |
| 2005/0218497 | A1 * | 10/2005 | Komuro | H01L 24/05 257/E23.008 |
| 2015/0282367 | A1 * | 10/2015 | Barth | H05K 13/00 361/728 |
| 2015/0313006 | A1 * | 10/2015 | Lane | H05K 1/0216 174/250 |
| 2016/0357882 | A1 * | 12/2016 | Dosluoglu | G06F 30/327 |
| 2016/0358866 | A1 * | 12/2016 | Zu | G06F 30/367 |
| 2021/0374318 | A1 * | 12/2021 | Yang | G06F 30/367 |
| 2022/0015233 | A1 * | 1/2022 | Farkas | H05K 1/116 |
| 2023/0038892 | A1 * | 2/2023 | Chen | H01L 25/50 |
| 2023/0317588 | A1 * | 10/2023 | Sun | H01L 23/49827 |
| 2025/0167104 | A1 * | 5/2025 | Hsu | H01L 24/13 |

* cited by examiner

*Primary Examiner* — Suchin Parihar
(74) *Attorney, Agent, or Firm* — Greenberg Traurig, LLP

(57) ABSTRACT

The disclosed computer-implemented method for automatically generating a printed circuit board design includes executing, by at least one processor based on input parameters, a grouping operation that identifies network shapes defining regions occupied by corresponding networks for one or more layers of an integrated circuit package. The method additionally includes identifying, by the at least one processor based on the identified network shapes, connections of the integrated circuit package. The method also includes automatically generating, by the at least one processor and based on the identified connections, a printed circuit board design. Various other methods, systems, and computer-readable media are also disclosed.

20 Claims, 12 Drawing Sheets

300

SYSTEMS AND METHODS FOR AUTOMATICALLY GENERATING A PRINTED CIRCUIT BOARD DESIGN

BACKGROUND

Power delivery network (PDN) pre-layout analysis is an integral step in an integrated circuit package design process. Currently, the layout work required to do the pre-layout analysis is a manual process performed by human designers. As a result, the PDN pre-layout portion of the integrated circuit package design process often requires several days to complete.

BRIEF DESCRIPTION OF THE DRAWINGS

The accompanying drawings illustrate a number of example implementations and are a part of the specification. Together with the following description, these drawings demonstrate and explain various principles of the present disclosure.

Figure 1:
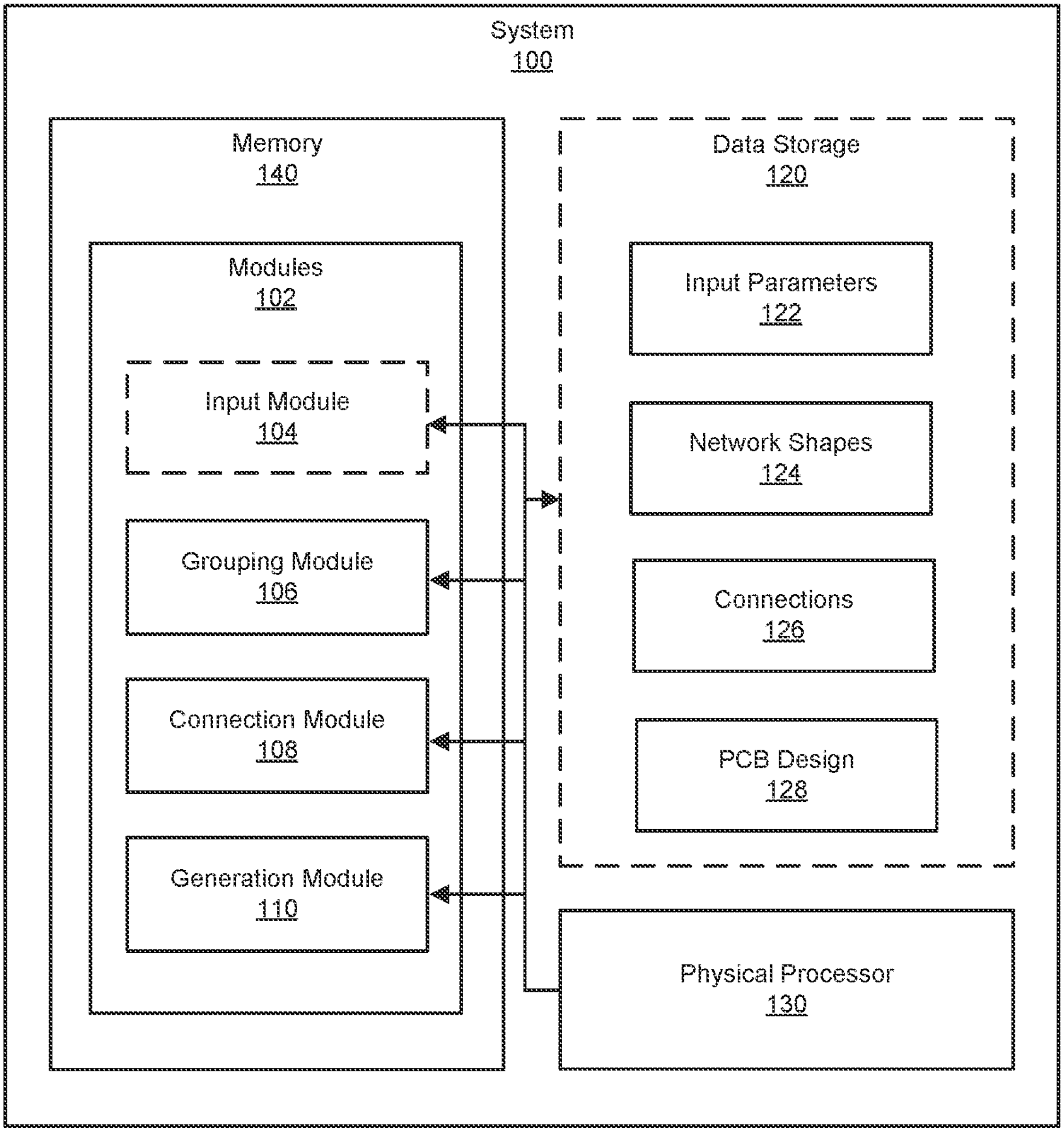
FIG. 1 is a block diagram of an example system for automatically generating a printed circuit board design.

Throughout the drawings, identical reference characters and descriptions indicate similar, but not necessarily identical, elements. While the examples described herein are susceptible to various modifications and alternative forms, specific embodiments have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to systems and methods for automatically generating a printed circuit board design. As disclosed herein, automated procedures can be used to achieve power plane creation and vertical connections, which are the key requirements in the pre-layout process. With minimal human intervention, the proposed procedures disclosed herein can achieve the physical layout necessary to perform pre-layout analysis, saving days over a human manually designing a layout for each project. Additionally, some examples described herein can allow input of different sets of design parameters to quickly generate multiple designs, allowing power delivery network (PDN) engineers to study multiple solutions and decide on the best one to use. This capability to quickly generate and evaluate multiple designs is not possible with humans manually designing the layout. As a result, the automation of the PDN pre-layout saves days for each project without sacrificing the quality of the layout.

In one example, a computer-implemented method can include executing, by at least one processor based on input parameters, a grouping operation that identifies network shapes defining regions occupied by corresponding networks for one or more layers of an integrated circuit package, identifying, by the at least one processor based on the identified network shapes, connections of the integrated circuit package, and automatically generating, by the at least one processor and based on the identified connections, a printed circuit board design.

In another example, the method of the previously described example method can further include receiving, by the at least one processor, the input parameters corresponding to at least one of integrated circuit parameters, input/output parameters, or discrete symbols.

Another example can be the method of any of the previously described example methods, wherein the one or more layers include at least one of a bump layer, a ball-grid array, or one or more transition layers.

Another example can be the method of any of the previously described example methods, wherein the grouping operation includes defining, by the at least one processor, a spread radius, merging, by the at least one processor, overlapped boundaries of geometric shapes formed according to the spread radius, and creating the network shapes according to the merged, overlapped boundaries.

Another example can be the method of any of the previously described example methods, wherein the grouping operation further includes prioritizing creation of network shapes based on maximum distance of corresponding networks from a center of the integrated circuit package.

Another example can be the method of any of the previously described example methods, wherein identifying the connections includes defining a minimum region of a transition layer, defining vertical connections of a bump layer to the transition layer, and defining vertical connections of the transition layer to a ball-grid array.

Another example can be the method of any of the previously described example methods, wherein defining the minimum region of the transition layer includes applying an OR logic operation to balls of the ball-grid array and bumps of the bump layer.

Another example can be the method of any of the previously described example methods, wherein defining the vertical connections of the bump layer to the transition layer includes identifying a ratio of stacked vias based on locations of die bumps.

Another example can be the method of any of the previously described example methods, wherein defining the vertical connections of the transition layer to the ball-grid array includes identifying a pattern of stacked vias based on locations of balls of the ball grid array.

In one example, a system can include at least one physical processor and physical memory including computer-executable instructions that, when executed by the physical processor, cause the physical processor to execute, based on input parameters, a grouping operation that identifies network shapes defining regions occupied by corresponding networks for one or more layers of an integrated circuit package, identify, based on the identified network shapes, connections of the integrated circuit package, and automatically generate, based on the identified connections, a printed circuit board design.

Another example can be the system of the previously described example system, wherein the instructions further cause the physical processor to receive the input parameters corresponding to at least one of integrated circuit parameters, input/output parameters, or discrete symbols.

Another example can be the system of any of the previously described example systems, wherein the one or more layers include at least one of a bump layer, a ball-grid array, or one or more transition layers.

Another example can be the system of any of the previously described example systems, wherein the grouping operation includes defining a spread radius, merging overlapped boundaries of geometric shapes formed according to the spread radius, and creating the network shapes according to the merged, overlapped boundaries.

Another example can be the system of any of the previously described example systems, wherein the grouping operation further includes prioritizing creation of network shapes based on maximum distance of corresponding networks from a center of the integrated circuit package.

Another example can be the system of any of the previously described example systems, wherein identifying the connections includes defining a minimum region of a transition layer, defining vertical connections of a bump layer to the transition layer, and defining vertical connections of the transition layer to a ball-grid array.

Another example can be the system of any of the previously described example systems, wherein defining the minimum region of the transition layer includes applying an OR logic operation to balls of the ball-grid array and bumps of the bump layer.

Another example can be the system of any of the previously described example systems, wherein defining the vertical connections of the bump layer to the transition layer includes identifying a ratio of stacked vias based on locations of die bumps.

Another example can be the system of any of the previously described example systems, wherein defining the vertical connections of the transition layer to the ball-grid array includes identifying a pattern of stacked vias based on locations of balls of the ball grid array.

In one example, a non-transitory computer-readable medium can include one or more computer-executable instructions that, when executed by at least one processor of a computing device, cause the computing device to execute, based on input parameters, a grouping operation that identifies network shapes defining regions occupied by corresponding networks for one or more layers of an integrated circuit package, identify, based on the identified network shapes, connections of the integrated circuit package, and automatically generate, based on the identified connections, a printed circuit board design.

Another example can be the previously described non-transitory computer-readable medium, wherein the instructions further cause the computing device to receive the input parameters corresponding to at least one of integrated circuit parameters, input/output parameters, or discrete symbols.

Figure 2:
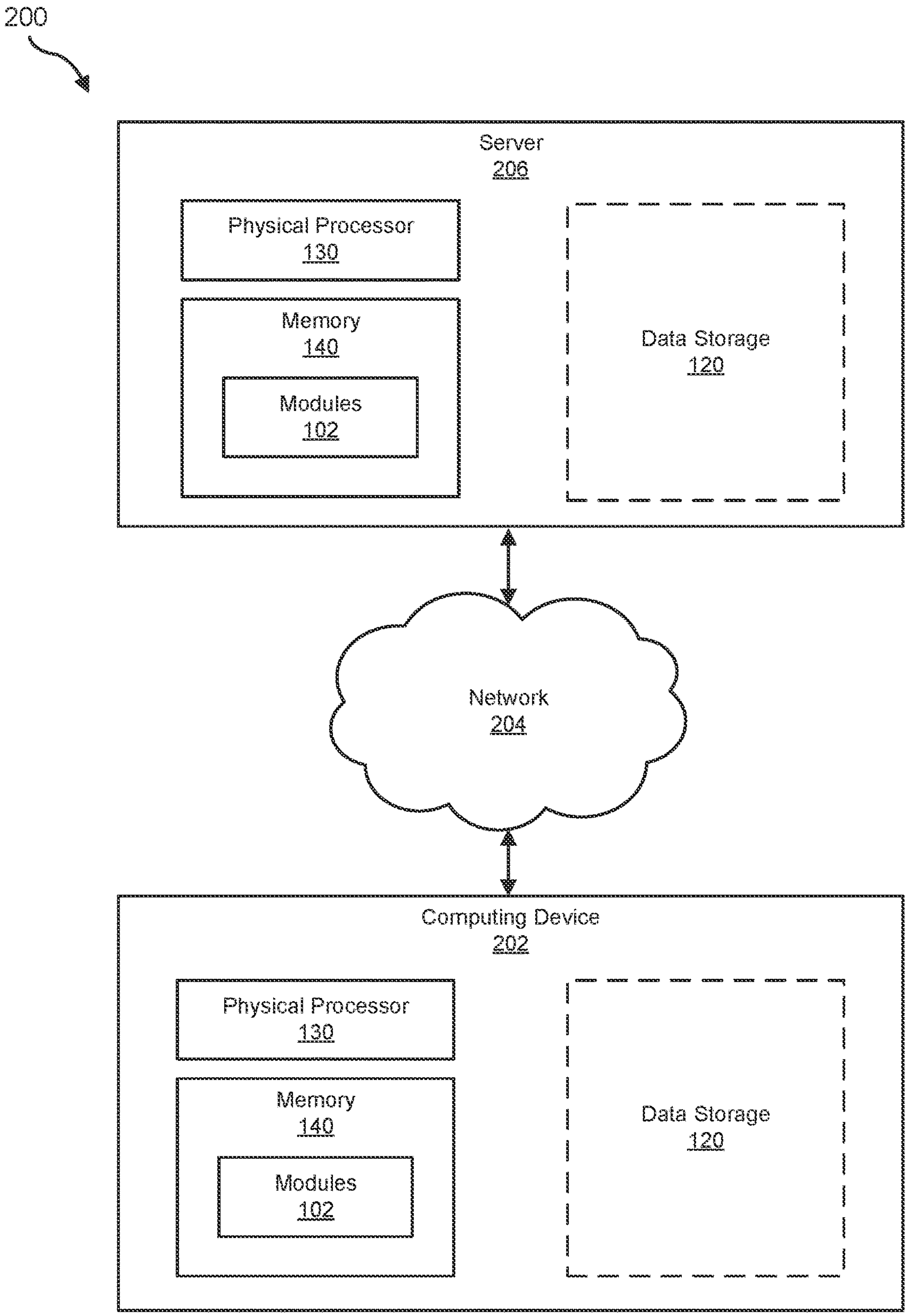
FIG. 2 is a block diagram of an additional example system for automatically generating a printed circuit board design.

The following will provide, with reference to FIGS. 1-2, detailed descriptions of example systems for automatically generating a printed circuit board design. Detailed descriptions of corresponding computer-implemented methods will also be provided in connection with FIG. 3. In addition, detailed descriptions of an example power delivery network (PDN) layout generation and evaluation process will be provided in connection with FIG. 4. Also, detailed descriptions of an example PDN layout generation process will be provided in connection with FIG. 5. Further, detailed descriptions of example net prioritizations will be provided in connection with FIGS. 6-7. In addition, detailed descriptions of an example grouping operation that identifies network shapes defining regions occupied by corresponding networks for one or more layers of an integrated circuit package will be provided in connection with FIGS. 8-10. Further, detailed descriptions of an example identification of vertical connections of the integrated circuit package will be provided in connection with FIG. 11. Finally, detailed descriptions of an example design of an integrated circuit package automatically generated based on the identified vertical connections will be provided in connection with FIG. 12.

FIG. 1 is a block diagram of an example system 100 for automatically generating a printed circuit board design. As illustrated in this figure, example system 100 includes one or more modules 102 for performing one or more tasks. As will be explained in greater detail below, modules 102 include a grouping module 106, a connection module 108, and a generation module 108. In some examples, modules 102 also include an input module 104. Although illustrated as separate elements, some examples of one or more of modules 102 in FIG. 1 represent portions of a single module or application.

In certain implementations, one or more of modules 102 in FIG. 1 represent one or more software applications or programs that, when executed by a computing device, cause the computing device to perform one or more tasks. For example, and as will be described in greater detail below, one or more of modules 102 represent modules stored and configured to run on one or more computing devices, such as the devices illustrated in FIG. 2 (e.g., computing device 202 and/or server 206). One or more of modules 102 in FIG. 1 also represent all or portions of one or more special-purpose computers configured to perform one or more tasks.

As illustrated in FIG. 1, example system 100 also includes one or more memory devices, such as memory 140. Memory 140 generally represents any type or form of volatile or non-volatile storage device or medium capable of storing data and/or computer-readable instructions. In one example, memory 140 stores, loads, and/or maintains one or more of modules 102. Examples of memory 140 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

As illustrated in FIG. 1, example system 100 also includes one or more physical processors, such as physical processor 130. Physical processor 130 generally represents any type or form of hardware-implemented processing unit capable of interpreting and/or executing computer-readable instructions. In one example, physical processor 130 accesses and/or modifies one or more of modules 102 stored in memory 140. Additionally or alternatively, physical processor 130 executes one or more of modules 102 to facilitate automatically generating a printed circuit board design. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

As illustrated in FIG. 1, example system 100 also includes one or more instances of stored data, such as data storage 120. Data storage 120 generally represents any type or form of stored data. In one example, data storage 120 includes databases, spreadsheets, tables, lists, matrices, trees, or any other type of data structure. Examples of data storage 120 include, without limitation, input parameters 122, network shapes 124, connections 126, and one or more PCB designs 128.

Example system 100 in FIG. 1 can be implemented in a variety of ways. For example, all or a portion of example system 100 can represent portions of example system 200 in FIG. 2. As shown in FIG. 2, system 200 includes a computing device 202 in communication with a server 206 via a network 204. In one example, all or a portion of the functionality of modules 102 is performed by computing device 202, server 206, and/or any other suitable computing system. As will be described in greater detail below, one or more of modules 102 from FIG. 1, when executed by at least one processor of computing device 202 and/or server 206, enable computing device 202 and/or server 206 to automatically generate a PCB design.

Computing device 202 generally represents any type or form of computing device capable of reading computer-executable instructions. For example, computing device is any computer capable of receiving, processing, and storing data. Additional examples of computing device 202 include, without limitation, laptops, tablets, desktops, servers, cellular phones, Personal Digital Assistants (PDAs), multimedia players, embedded systems, wearable devices (e.g., smart watches, smart glasses, etc.), smart vehicles, so-called Internet-of-Things devices (e.g., smart appliances, etc.), gaming consoles, variations or combinations of one or more of the same, or any other suitable computing device.

Server 206 generally represents any type or form of computing device that is receiving, processing, and storing data. Additional examples of server 206 include, without limitation, storage servers, database servers, application servers, and/or web servers configured to run certain software applications and/or provide various storage, database, and/or web services. Although illustrated as a single entity in FIG. 2, other examples of server 206 include and/or represent a plurality of servers that work and/or operate in conjunction with one another.

Network 204 generally represents any medium or architecture capable of facilitating communication or data transfer. In one example, network 204 facilitates communication between computing device 202 and server 206. In this example, network 204 facilitates communication or data transfer using wireless and/or wired connections. Examples of network 204 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), portions of one or more of the same, variations or combinations of one or more of the same, or any other suitable network.

In various examples, many other devices or subsystems are connected to system 100 in FIG. 1 and/or system 200 in FIG. 2. Conversely, all of the components and devices illustrated in FIGS. 1 and 2 need not be present to practice the implementations described and/or illustrated herein. The devices and subsystems referenced above also are interconnected in different ways from that shown in FIG. 2. Systems 100 and 200 also employ any number of software, firmware, and/or hardware configurations. For example, one or more of the example implementations disclosed herein can be encoded as a computer program (also referred to as computer software, software applications, computer-readable instructions, and/or computer control logic) on a computer-readable medium.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Figure 3:
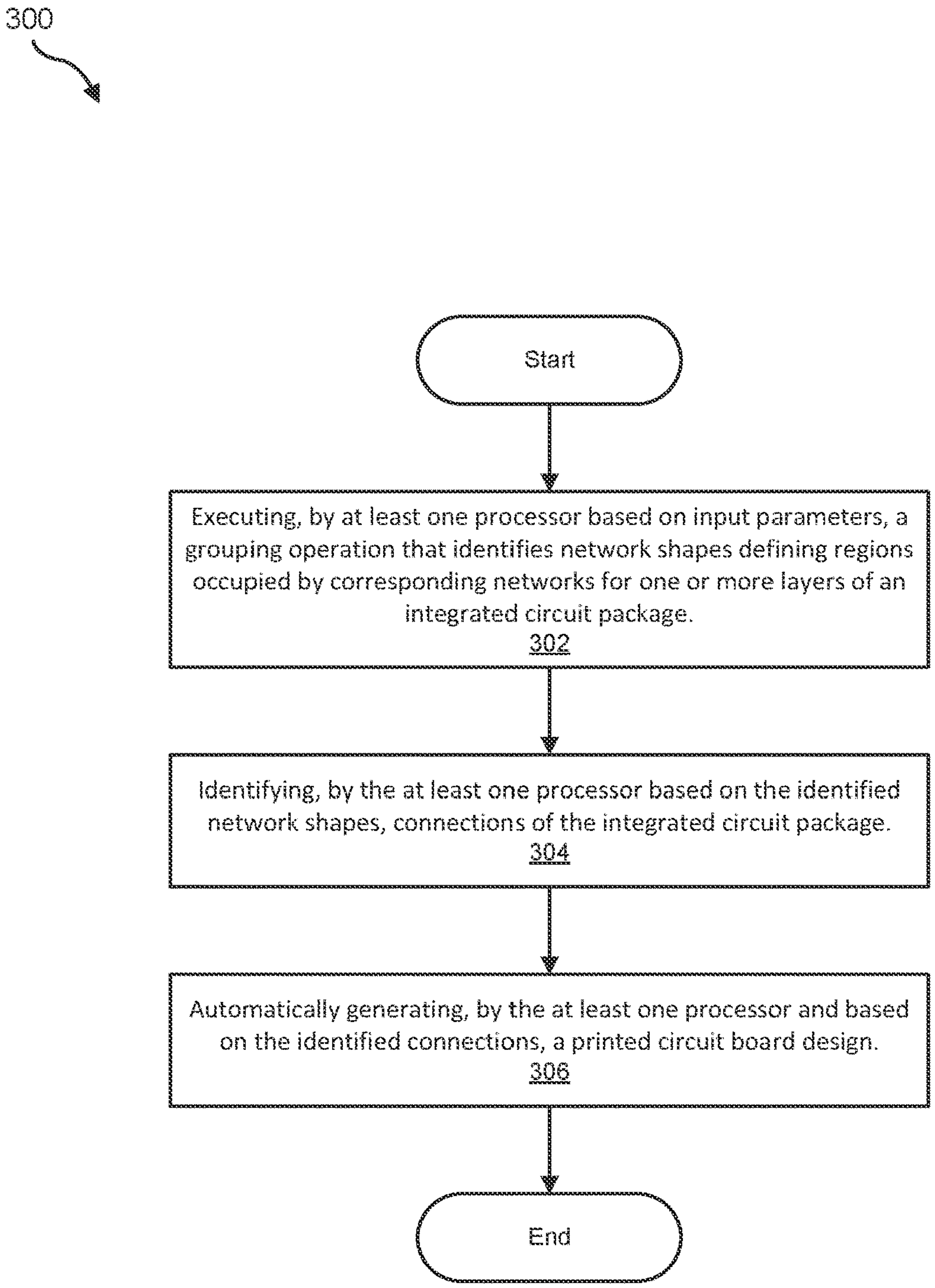
FIG. 3 is a flow diagram of an example method for automatically generating a printed circuit board design.

FIG. 3 is a flow diagram of an example computer-implemented method 300 for automatically generating a printed circuit board design. The steps shown in FIG. 3 are performed by any suitable computer-executable code and/or computing system, including system 100 in FIG. 1, system 200 in FIG. 2, and/or variations or combinations of one or more of the same. In one example, each of the steps shown in FIG. 3 represents an algorithm whose structure includes and/or is represented by multiple sub-steps, examples of which will be provided in greater detail below.

As illustrated in FIG. 3, at step 302 one or more of the systems described herein executes a grouping operation. For example, grouping module 106, as part of computing device 202 in FIG. 2, executes, by at least one processor based on input parameters, a grouping operation that identifies network shapes defining regions occupied by corresponding networks for one or more layers of an integrated circuit package.

The term "network," as used herein, generally refers to a system of interconnected electronic components or circuits. For example, a network can refer to, without limitation, a communication network and/or a power delivery network implemented on a chip according to system-on-chip methodologies.

The term "network shape," as used herein, generally refers to a region of a layer of an integrated circuit. For example, and without limitation, a network shape can refer to a region of a bump layer and/or a ball-grid array (BGA) layer that is occupied by a network. In some examples, network shapes are geometric shapes. In some of these examples, the geometric shapes are simple polygons (e.g., circles, triangles, squares, rectangles, etc.).

The term "layer," as used herein, generally refers to a layer of an integrated circuit (IC) package. For example, and without limitation, a layer can correspond to a bump layer, a BGA layer, and/or one or more transition layers. In some of these examples, the layers are flat and generally arranged in parallel planes, with a transition layer being disposed between a bump layer and a BGA layer.

The term "integrated circuit package," as used herein, generally refers to a semiconductor device. For example, and without limitation, an IC package can be configured for installation as part of a printed circuit board (PCB). IC packaging indicates the dimension and shape of a chip. Chips with the same electronic parameters often have different IC packages. Typically, IC packages are composed of layers (e.g., bump layer, BGA layer, and one or more transition layers), as described above.

The systems described herein can perform step 302 in a variety of ways. In some examples, input module 104, as part of computing device 202 in FIG. 2, also receives, by the at least one processor, the input parameters. Example input parameters correspond to integrated circuit parameters, input/output parameters, and/or discrete symbols. In various examples, the one or more layers include a bump layer, a ball-grid array, and/or one or more transition layers. In some examples, the grouping operation includes defining, by the at least one processor, a spread radius, merging, by the at least one processor, overlapped boundaries of geometric shapes formed according to the spread radius, and creating the network shapes according to the merged, overlapped boundaries. An example range of a spread radius for expanding pins of a network is 600-700 microns (e.g., 500 microns). An example range of a spread radius for pins of bump to capacitor connections corresponds to 4000-6000 microns (e.g., 5000 microns). In some of these examples, the grouping operation further includes prioritizing creation of network shapes based on maximum distance of corresponding networks from a center of the integrated circuit package. Additional details of example grouping operations are provided later in connection with FIGS. 6-10.

At step 304, one or more of the systems described herein can identify connections. For example, connection module 108, as part of computing device 202 in FIG. 2, identifies, by the at least one processor based on the identified network shapes, connections of the integrated circuit package.

As used herein, the term "connection," generally refers to an electrical pathway. For example, and without limitation, a connection can correspond to a set of stacked vias formed in and/or between layers of an IC package. For example, stacked vias are formed in barrier layers disposed between a transition layer and one or more semiconductor layers and/or metal layers.

The systems described herein can perform step 304 in a variety of ways. In some examples, connection module 108, as part of computing device 202 in FIG. 2, identifies the connections at least in part by defining a minimum region of a transition layer, defining vertical connections of a bump layer to the transition layer, and/or defining vertical connections of the transition layer to a ball-grid array. In some of these examples, defining the minimum region of the transition layer includes applying an OR logic operation to balls of the ball-grid array and bumps of the bump layer. Alternatively or additionally, some of these examples include defining the vertical connections of the bump layer to the transition layer at least in part by identifying a ratio of stacked vias based on locations of die bumps. Alternatively or additionally, some of these examples include defining the vertical connections of the transition layer to the ball-grid array at least in part by identifying a pattern of stacked vias based on locations of balls of the ball grid array. Additional details of example identifications of connections are provided later in connection with FIG. 11.

At step 306, one or more of the systems described herein automatically generate a PCB design. For example, generation module 110, as part of computing device 202 in FIG. 2, automatically generates, by the at least one processor and based on the identified connections, a printed circuit board design.

The term "printed circuit board design," as used herein, generally refers to a design aspect of a laminated sandwich structure of conductive and insulating layers. For example, and without limitation, a PCB design can correspond to at least one component of a PCB, such as an IC package configured for connection to a board in manufacturing a PCB.

The term "bump layer," as used herein, generally refers to a wafer having one or more solder points. For example, and without limitation, a bump layer can correspond to a wafer having a plurality of solder balls placed on top of a large piece of metal at a top metal layer.

The term "BGA layer," as used herein, generally refers to solder balls on a PCB. For example, and without limitation, a BGA layer can correspond to a type of surface-mount packaging (e.g., a chip carrier) used for integrated circuits.

The term "transition layer," as used herein, generally refers to any inner layer or layers of a multi-layer system (e.g., package, PCB, etc). For example, and without limitation, transition layer can refer to a semiconductor region, a layer between semiconductor regions of different electrical properties, or between a semiconductor and a layer of a different type. In some examples, a transition layer can be characterized by a potential barrier impeding the movement of charge carriers from one region to the other.

The systems described herein can perform step 306 in a variety of ways. In some examples, generation module 108, as part of computing device 202 in FIG. 2, stores an electronic record (e.g., 3D model) that includes the identified network shapes for the one or more layers and the identified connections. In some of these examples, the electronic record includes identified network shapes for a bump layer, one or more transition layers, a ball-grid layer, identified vertical connections between the layers, and/or identified horizontal (e.g., bump to capacitor) connections. Additional details of example PCB design generations are provided later in connection with FIG. 12.

Figure 4:
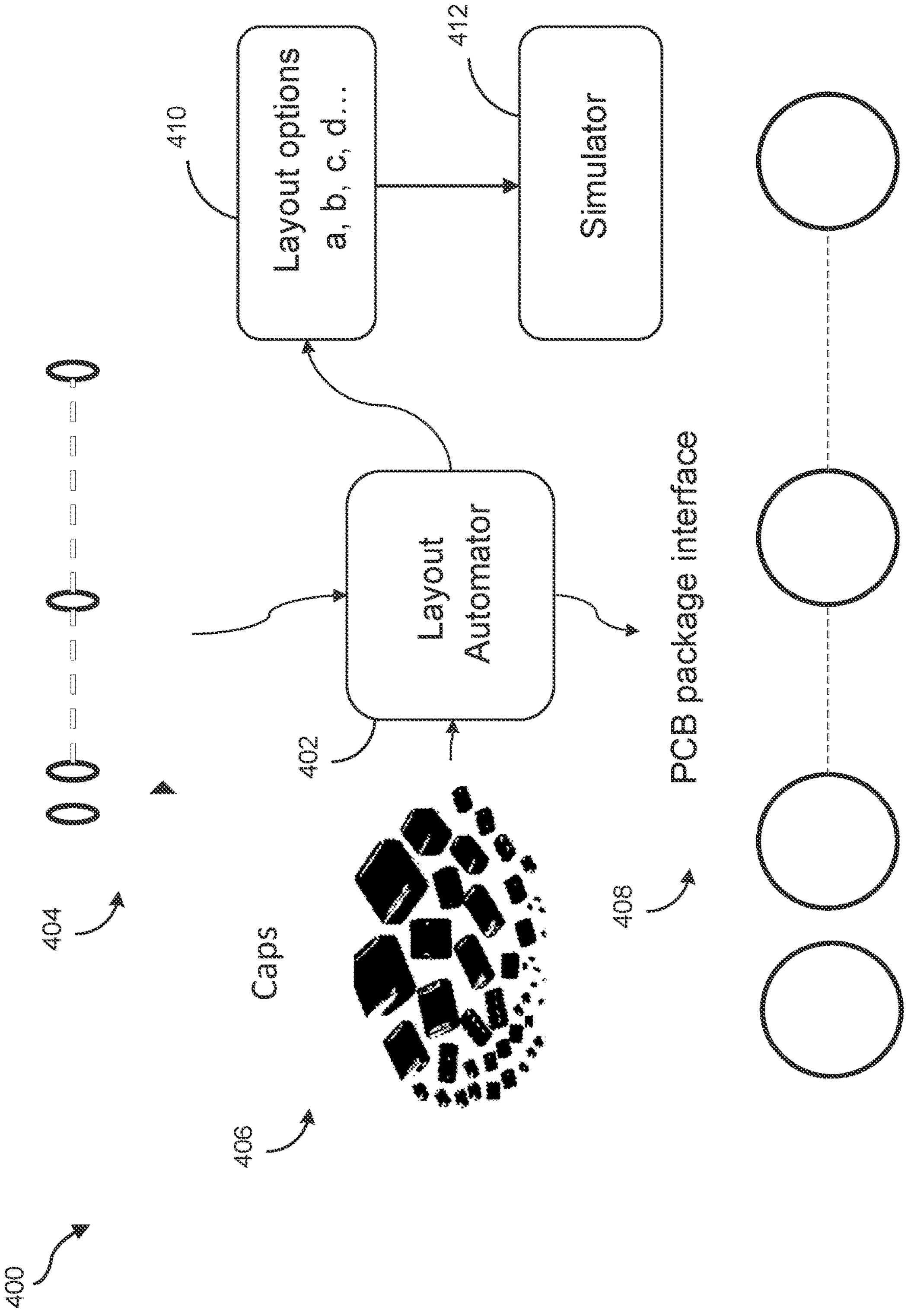
FIG. 4 is a block diagram illustrating an example power delivery network (PDN) pre-layout generation and evaluation process.

FIG. 4 illustrates an example power delivery network (PDN) pre-layout generation and evaluation process 400. For example, a layout automator 402 has one or more inputs (e.g., integrated circuit parameters, input/output parameters, and/or discrete symbols), such as a die package interface 404, capacitors 406, etc. Layout automator 402 also has one or more outputs, such as PCB package interface 408 and layout options 410. In some examples, the layout options 410 are evaluated using a computer simulation to test performance. In some examples, the evaluation also includes evaluation by experts, such as a cost benefit analysis, miniaturization characteristics, etc. In some examples, based on the evaluation, one of the layout options is selected and used to manufacture an IC package and/or a PCB.

Layout automator 402 formulates the process of developing a physical layout into a set of logical and automatable steps, allowing multiple solutions based on different sets of input parameters. In some examples, the input parameters are selected by a user employing a graphic user interface (GUI) having various choices of parameters as selectable options. In this way, layout automator 402 achieves the pre-layout for early-stage process integration (PI) analysis, with connections being performed automatically using simple geometries to capture critical electrical characteristics of PDN.

Figure 5:
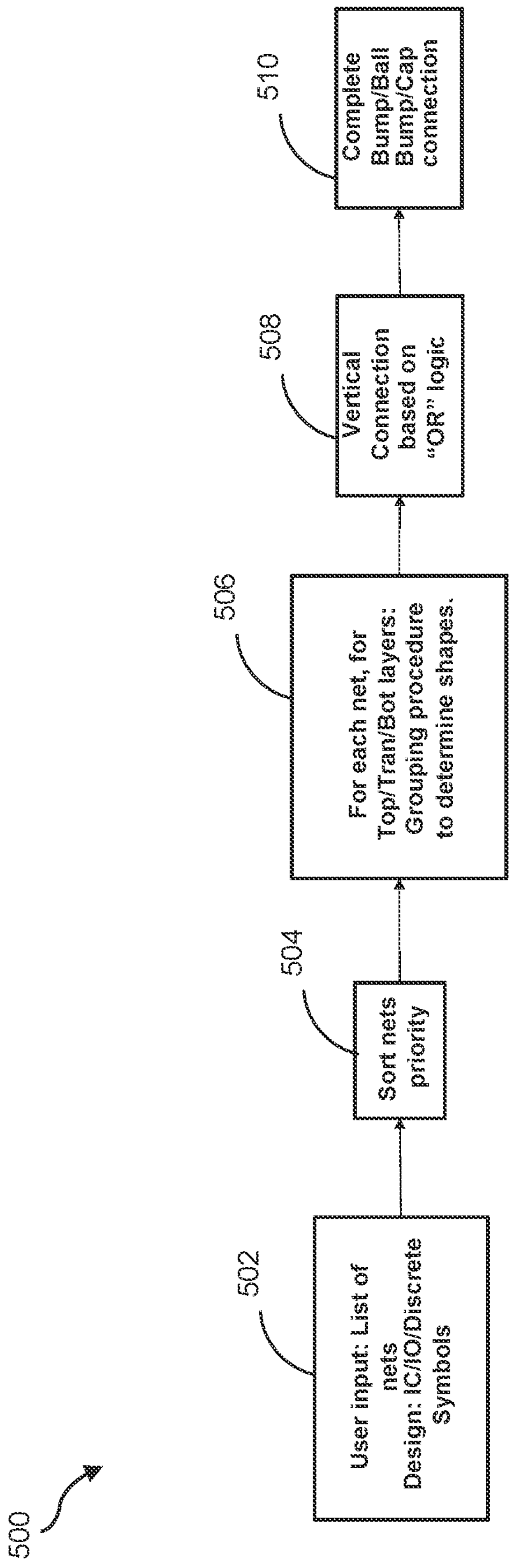
FIG. 5 is a flow diagram illustrating an example PDN pre-layout generation process.

FIG. 5 illustrates an example PDN pre-layout generation process 500. Beginning at process stage 502, a plurality of user inputs are received, such as a list of networks and/or discrete symbols for IC and/or input/output (I/O). At process stage 504, a first portion of the grouping operation prioritizes (e.g., sorts) the networks. At process stage 506, a second portion of the grouping operation determines the network shapes for the bump and ball-grid layers. For example, bump, bottom (i.e., BGA), and transition layer are created, and the bump and BGA layers regions/shapes are defined using the grouping algorithm. In some examples, bump to discrete (or chip-chip) connections are also identified using the grouping operation with an adjusted spread radius. At process stage 508, vertical connections are identified based on an OR logic operation, and these connections determine network shapes for a transition layer. For example, a minimum region in the transition layer is defined using an OR logic operation. In some examples, connections between the bump to transition layer correspond to a ratio of stacked vias based on locations of the die bumps. In some of these examples, connections between the transition layer and BGA layer correspond to a pattern of stacked vias based on locations of the BGA balls. In various examples, the stacked vias are single structures or more complex structures, depending on physical design constraints. With the network shapes and connections thus determined, process stage 510 completes the generation of the PCB design by recording these details in an electronic record (e.g., 3D model).

Figure 6:
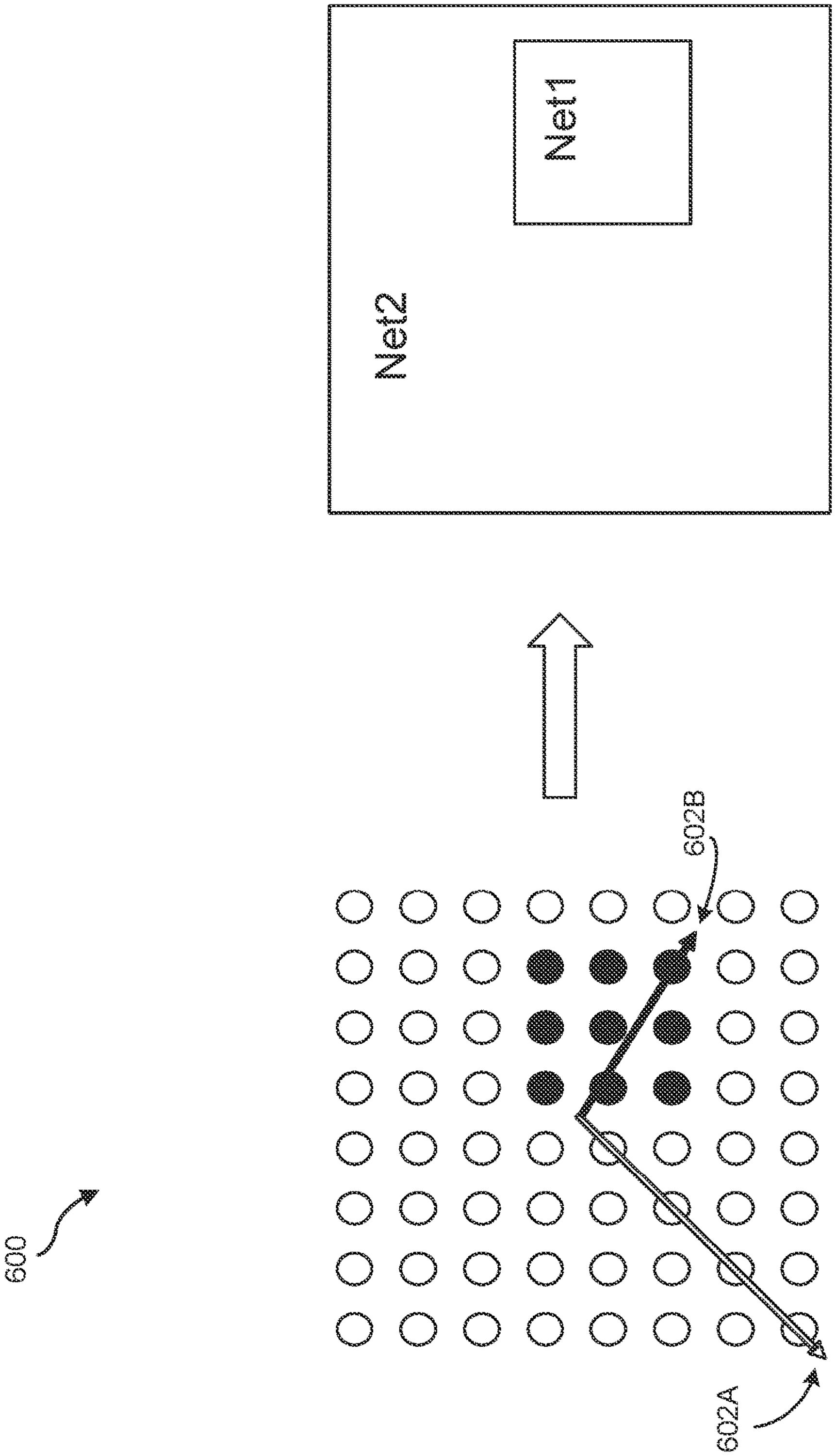
FIG. 6 is a block diagram illustrating an example of network prioritization.

FIG. 6 illustrates an example 600 of network (net) prioritization. The net prioritization is performed in some examples because simple geometric polygons inevitably overlap for multiple nets. In prioritizing the networks, the plane of the net Net2 that is drawn later has precedence over a net Net1 that is drawn earlier. Net sorting ensures larger planes are drawn first by investigating max distance (e.g., dist Net2 602A and dist Net1 602B) from die center. In the example of FIG. 6, Net2 is drawn before Net1 because dist Net2>dist Net1. An example pseudocode for prioritization of the two nets Net1 and Net2 based on their respective max distances dist1 and dist2 corresponds to:

```
listNets = [net1,net2]
netsDistance = [(net1,dist1),(net2,dist2)]
Sort( dist descending)
netPriority = [net2, net1].
```

Figure 7:
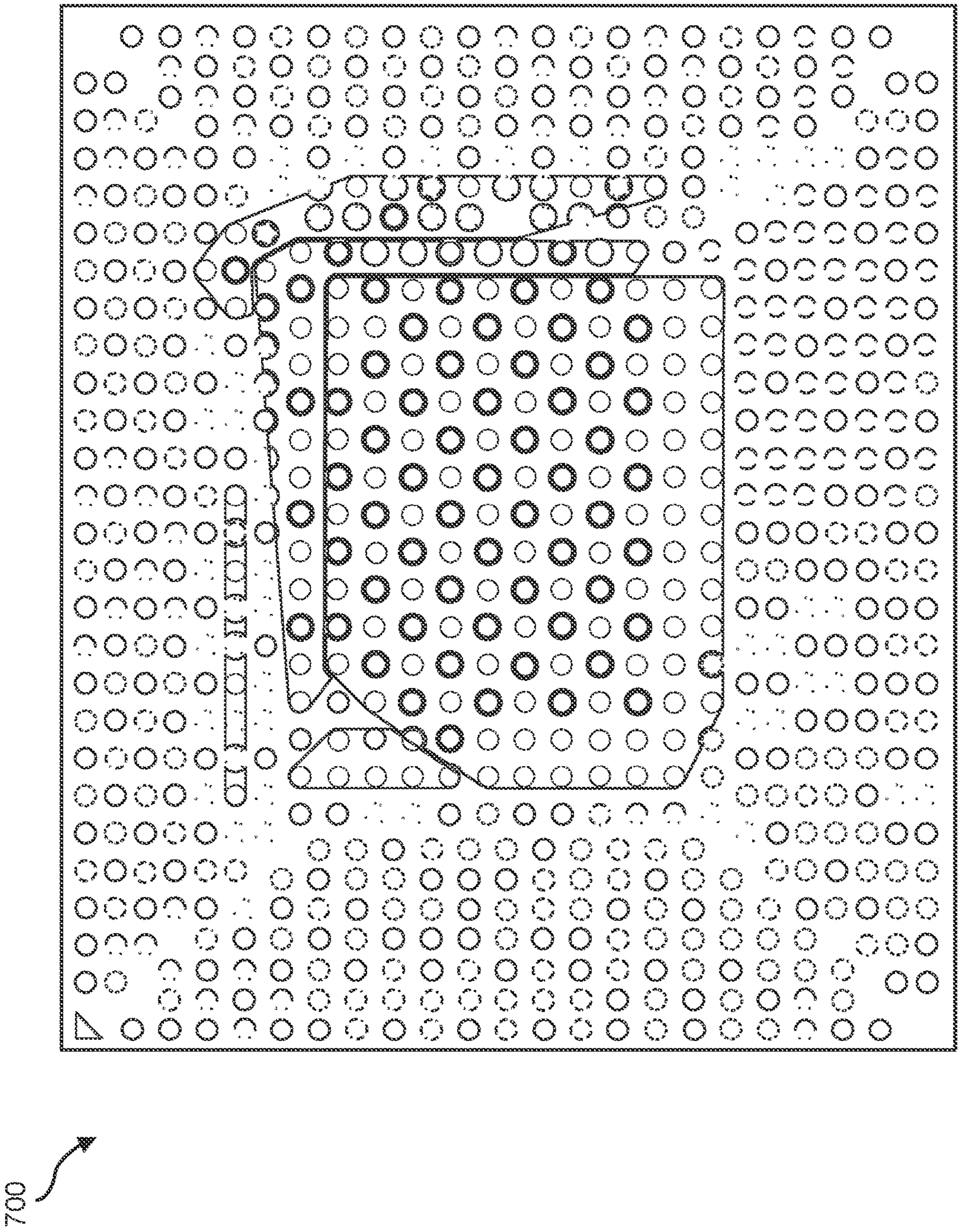
FIG. 7 is a block diagram illustrating another example of network prioritization.

FIG. 7 illustrates an example result 700 of net prioritization in accordance with this procedure.

Figure 8:
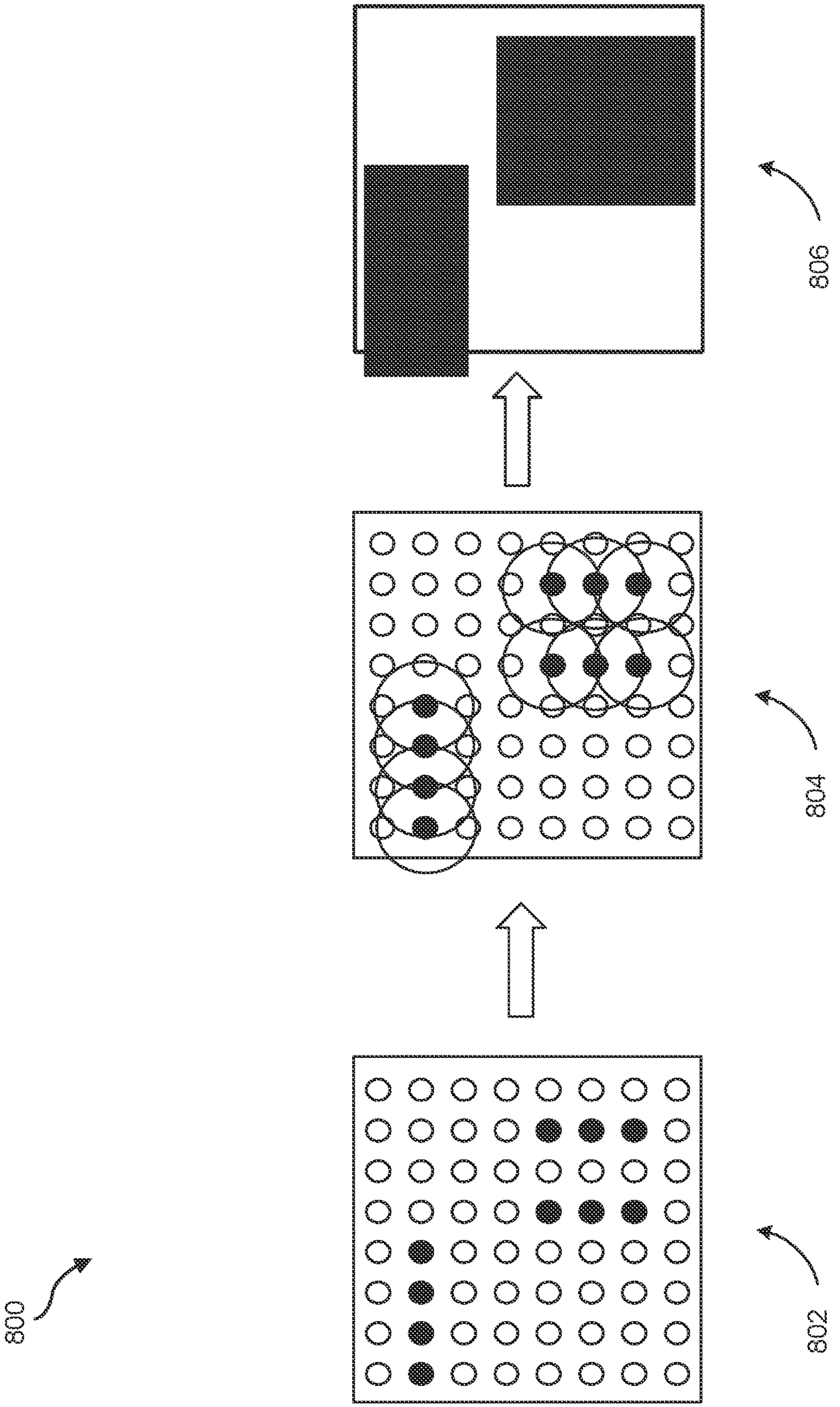
FIG. 8 is a block diagram illustrating an example grouping operation that identifies network shapes defining regions occupied by corresponding networks for one or more layers of an integrated circuit package.

FIG. 8 is a block diagram illustrating an example grouping operation 800 that identifies network shapes defining regions occupied by corresponding networks for one or more layers of an integrated circuit package. For example, bumps or balls are occupied by nets of a layer 802. As shown at 804, a spread radius is applied to expand a polygon (e.g., a circle) about each net pin (e.g., bumps or balls) of each net. The overlapped boundaries of these expanded polygons are merged at 806 to create shapes (e.g., rectangles) defining the net regions of a layer. An example pseudocode for performing the grouping operation corresponds to:

```
listNets = [net1,net2,...]
Foreach(net listNets
netPins = [p1,p2,p3,...]
Foreach(pin net1Pins
   polyList = createExpandedPolygon(pin))
   mPoly = mergePolygons(polyList)
   drawShape(mPoly))
```

Figure 9:
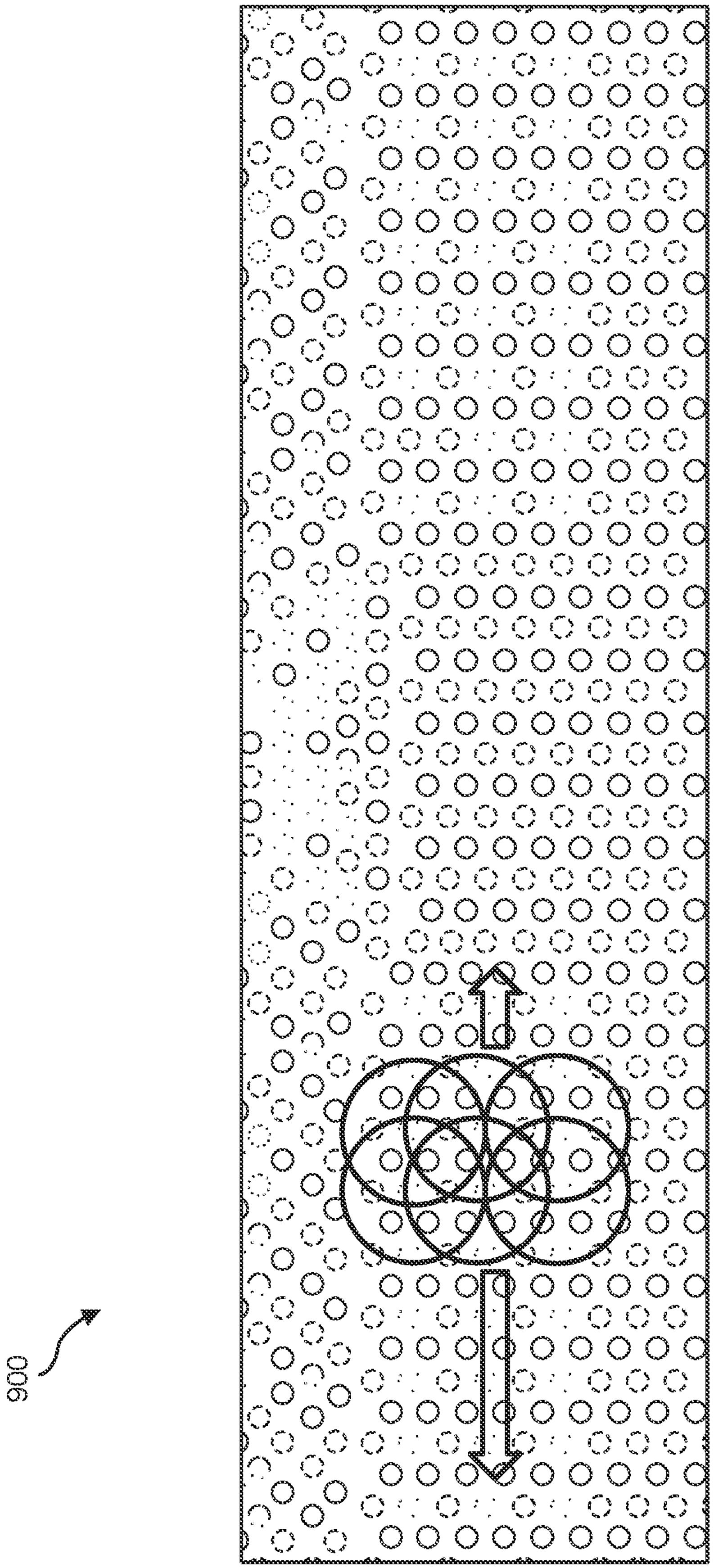
FIG. 9 is a block diagram illustrating another example of the grouping operation.
Figure 10:
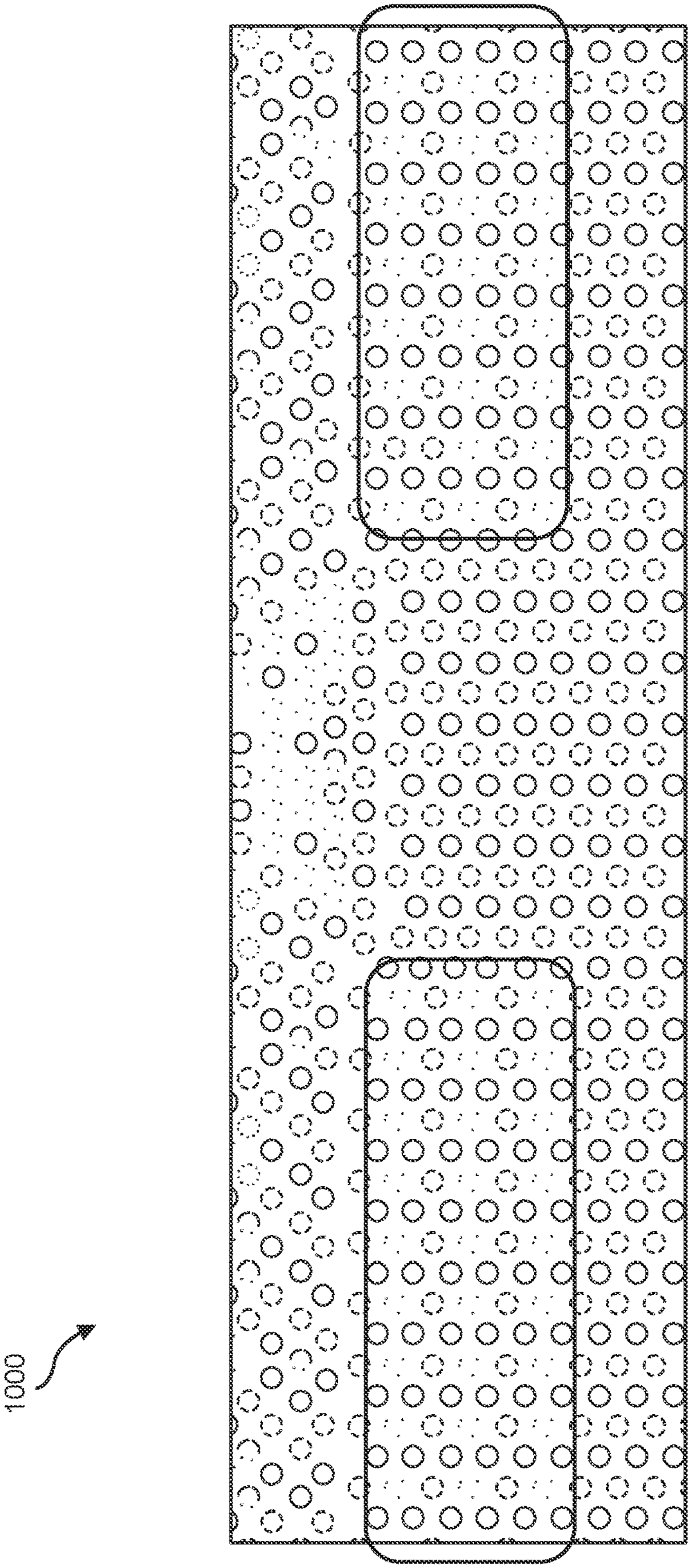
FIG. 10 is a block diagram illustrating network shapes defining regions occupied by corresponding networks according to application of the example grouping operation.

As shown in FIG. 9 at 900, some examples of the grouping procedure apply the grouping operation to a dimension (e.g., height) of a net region, and sweep incrementally along another dimension (e.g., width) of the net to result in shapes 1000 depicted in FIG. 10.

Figure 11:
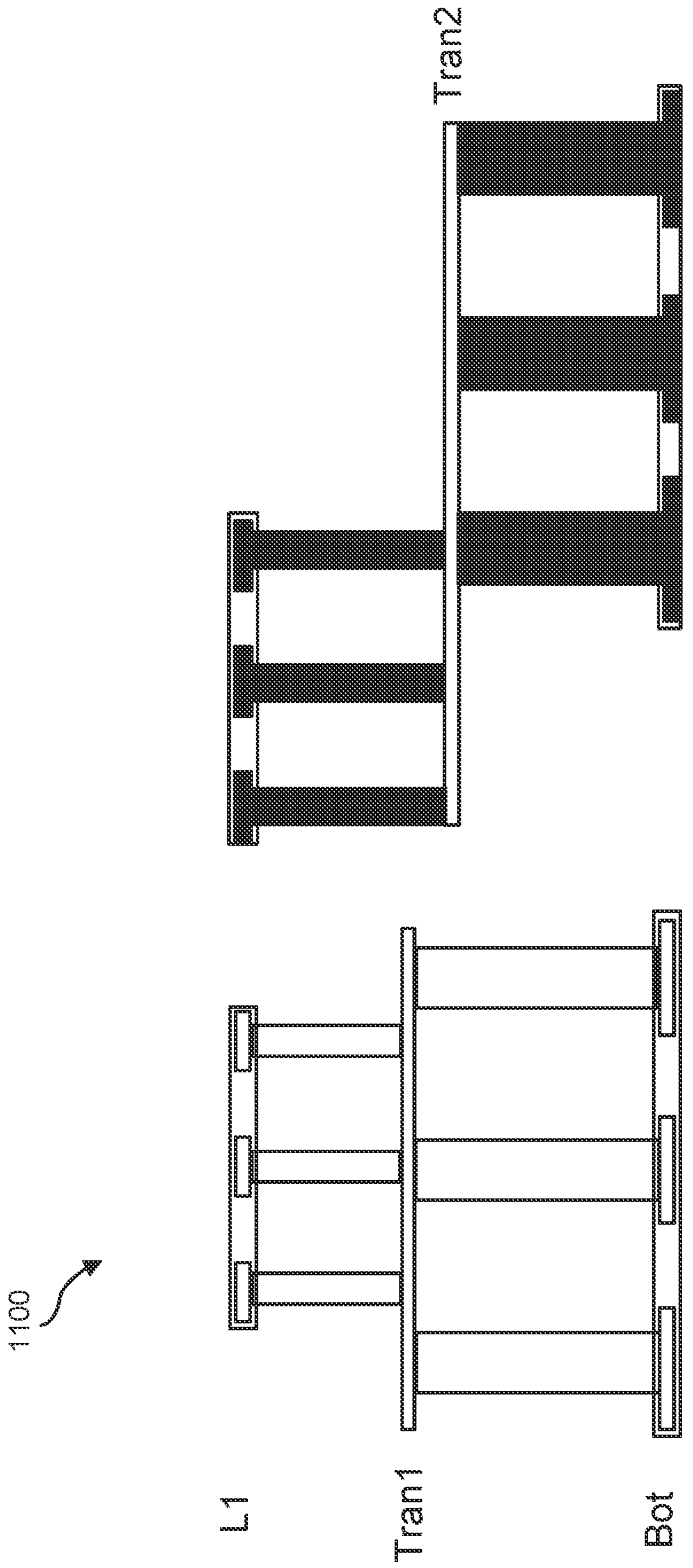
FIG. 11 is a block diagram illustrating an example identification of vertical connections of the integrated circuit package.

FIG. 11 is a block diagram illustrating example identification of vertical connections 1100 of the integrated circuit package. For example, an OR logic operation is used to identify connections between balls within shapes of a bump layer L1 and one or more transition layers Tran1 and Tran2, and between bumps within shapes of a BGA layer Bot and the one or more transition layers. Application of the OR logic identifies a region of the transition layer if either a ball located above that region or a bump located below that region is within an identified network shape. In some of these examples, the identified region corresponds to a minimum region of the one or more transition layers Tran1 and Tran2. In additional or alternative examples, vertical connections of the bump layer to the transition layer are identified as a ratio of stacked vias based on locations of die bumps. In additional or alternative examples, vertical connections of the transition layer to the ball-grid array are identified as a pattern of stacked vias based on locations of balls of the ball grid array.

Figure 12:
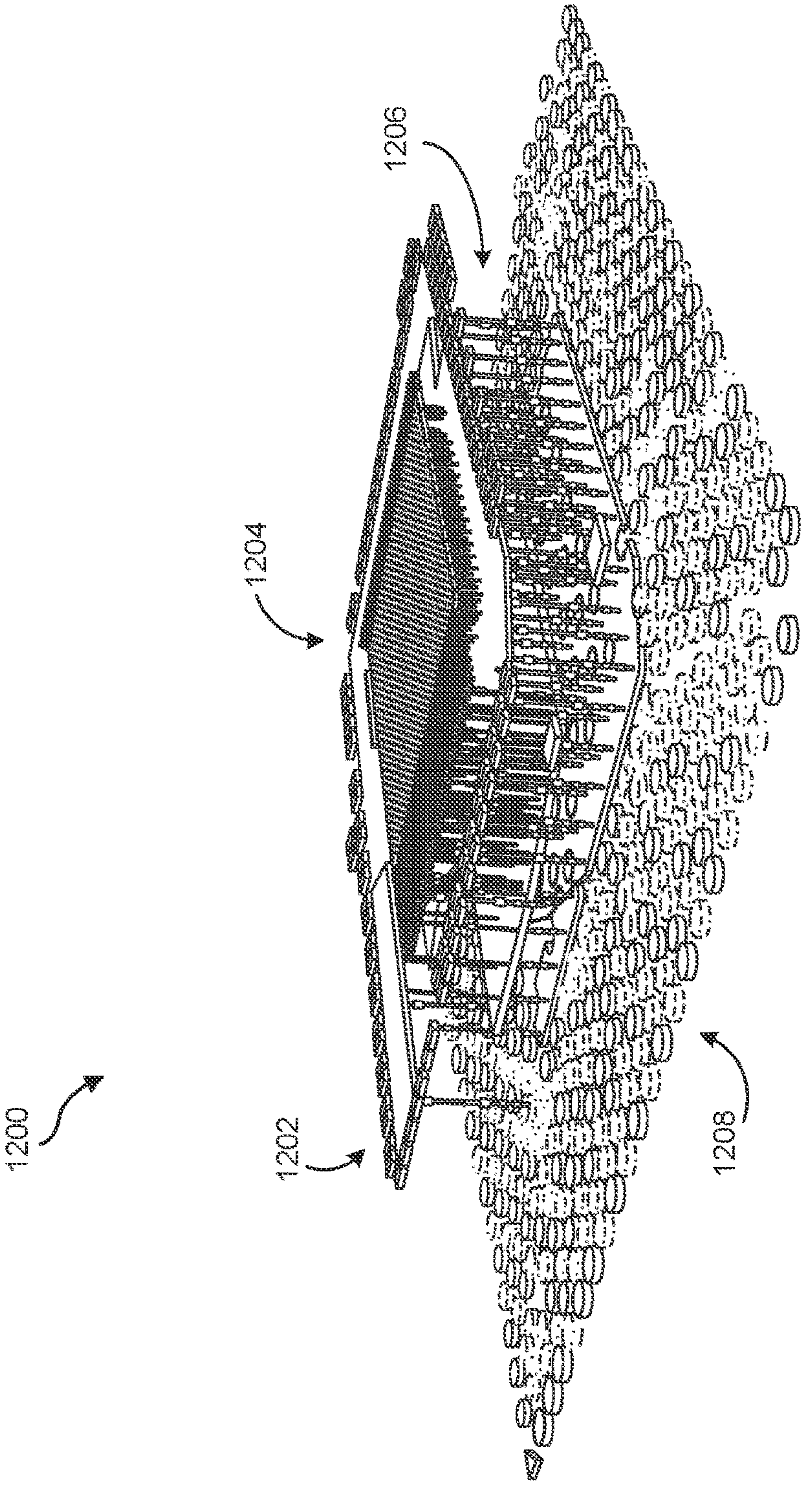
FIG. 12 is a rising view of an example design of an integrated circuit package automatically generated based on the identified vertical connections.

FIG. 12 is a rising view of an example design of an integrated circuit package automatically generated based on the identified connections. For example, an electronic record (e.g., 3D model) records the critical electrical characteristics of the PDN network based on a set of input parameters (e.g., capacitors, nets, placement, etc.). In some examples, multiple such electronic records are created based on different sets of input parameters, and these multiple electronic records are subjected to evaluation, ultimately resulting in selection of one of the electronic records, which is used in a PCB manufacturing process. In some of these examples, the evaluation includes providing the multiple electronic records as inputs to a computerized simulator configured to evaluate the multiple designs for the IC package.

The disclosed systems and methods, as described above, can provide automatable pre-layout procedures that achieve power planes creation and vertical connection identification, which are key requirements in the pre-layout process. With minimal human intervention, the disclosed systems and methods can generate the physical layout necessary to perform the pre-layout analysis, thus saving days compared to a human performing the layout manually for each project. Providing different requirements/tweaks as input parameters to the disclosed systems and methods also provides different flavors of the physical layouts that are created, allowing PDN engineers to study multiple designs and decide on the best design, which was not possible with humans manually designing the layout.

While the foregoing disclosure sets forth various implementations using specific block diagrams, flowcharts, and examples, each block diagram component, flowchart step, operation, and/or component described and/or illustrated herein is implemented, individually and/or collectively, using a wide range of hardware, software, or firmware (or any combination thereof) configurations. In addition, any disclosure of components contained within other components should be considered example in nature since many other architectures are often implemented to achieve the same functionality.

In some examples, all or a portion of example system 100 in FIG. 1 represents portions of a cloud-computing or network-based environment. Cloud-computing environments provide various services and applications via the Internet. These cloud-based services (e.g., software as a service, platform as a service, infrastructure as a service, etc.) are accessible through a web browser or other remote interface. Various functions described herein are provided through a remote desktop environment or any other cloud-based computing environment.

In various implementations, all or a portion of example system 100 in FIG. 1 facilitates multi-tenancy within a cloud-based computing environment. In other words, the modules described herein configure a computing system (e.g., a server) to facilitate multi-tenancy for one or more of the functions described herein. For example, one or more of the modules described herein program a server to enable two or more clients (e.g., customers) to share an application that is running on the server. A server programmed in this manner shares an application, operating system, processing system, and/or storage system among multiple customers (i.e., tenants). One or more of the modules described herein also partitions data and/or configuration information of a multi-tenant application for each customer such that one customer cannot access data and/or configuration information of another customer.

According to various implementations, all or a portion of example system 100 in FIG. 1 is implemented within a virtual environment. For example, the modules and/or data described herein reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 represents portions of a mobile computing environment. Mobile computing environments are implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein are provided for a mobile computing environment and/or interact with a mobile computing environment.

The process parameters and sequence of steps described and/or illustrated herein are given by way of example only and are variable as desired. For example, while the steps illustrated and/or described herein are shown or discussed in a particular order, these steps do not necessarily need to be performed in the order illustrated or discussed. The various example methods described and/or illustrated herein also omit one or more of the steps described or illustrated herein or include additional steps in addition to those disclosed.

While various implementations have been described and/or illustrated herein in the context of fully functional computing systems, one or more of these example implementations are distributed as a program product in a variety of forms, regardless of the particular type of computer-readable media used to actually carry out the distribution. The implementations disclosed herein are also implemented using modules that perform certain tasks. These modules include script, batch, or other executable files that are stored on a computer-readable storage medium or in a computing system. In some implementations, these modules configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computer-implemented method comprising:

automatically generating, by at least one processor and based on IC package data identifying one or more networks of an IC package, a printed circuit board design of a printed circuit board of the IC package, wherein automatically generating the printed circuit board design includes for each respective layer included in one or more first layers of the printed circuit board design, identifying, based on the IC package data, one or more regions of the respective layer occupied by one or more respective networks and generating one or more shapes corresponding to the one or more regions of the respective layer; and generating, based on the one or more shapes corresponding to the one or more regions of the one or more first layers, a layout for a plurality of connections in a second layer of the printed circuit board design.

2. The method of claim 1, further comprising:

receiving, by the at least one processor, the IC package data, wherein the IC package data include one or more input parameters corresponding to at least one of:

integrated circuit parameters;

input/output parameters; or discrete symbols.

3. The method of claim 1, wherein the one or more first layers include at least one of a bump or a ball-grid array and wherein one or more transition layers of the printed circuit board design include the second layer.

4. The method of claim 1, wherein generating the one or more shapes corresponding to the one or more regions occupied by the one or more respective networks includes:

defining, by the at least one processor, a spread radius;

merging, by the at least one processor, overlapped boundaries of geometric shapes formed according to the spread radius; and creating the one or more shapes corresponding to the one or more regions according to the merged, overlapped boundaries.

5. The method of claim 4, wherein generating the one or more shapes corresponding to the one or more regions occupied by the one or more respective networks further includes prioritizing creation of the one or more shapes based on respective maximum distances of the one or more regions corresponding to the one or more shapes from a center of the IC package.

6. The method of claim 1, wherein the one or more first layers include a bump layer and a ball-grid array, and wherein generating the layout for the plurality of connections in the second layer of the printed circuit board design includes, for each respective network of the one or more networks of the IC package:

defining a respective region of the second layer corresponding to the respective network;

defining a plurality of vertical connections of the respective network between the bump layer and the respective region of the second layer; and defining a plurality of vertical connections of the respective network between the respective region of the second layer and the ball-grid array.

7. The method of claim 6, wherein defining the respective region of the second layer corresponding to the respective network includes determining whether a region of the ball-grid array above a portion of the second layer corresponds to the respective network or a region of the bump layer below the portion of the second layer corresponds to the respective network.

8. The method of claim 6, wherein the plurality of vertical connections of the bump layer to the second layer includes a plurality of stacked vias.

9. The method of claim 6, wherein defining the plurality of vertical connections of the second layer to the ball-grid array includes identifying a pattern of stacked vias based on a plurality of locations of a plurality of balls of the ball-grid array.

10. A system comprising:

at least one physical processor; and physical memory comprising computer-executable instructions that, when executed by the physical processor, cause the physical processor to perform operations including:

automatically generating, based on IC package data identifying one or more networks of an IC package, a printed circuit board design of a printed circuit board of the IC package, wherein automatically generating the printed circuit board design includes for each respective layer included in one or more first layers of the printed circuit board design, identifying, based on the IC package data, one or more regions of the respective layer occupied by one or more respective networks and generating one or more shapes corresponding to the one or more regions of the respective layer; and generating, based on the one or more shapes corresponding to the one or more regions of the one or more first layers, a layout for a plurality of connections in a second layer of the printed circuit board design.

11. The system of claim 10, wherein the operations further include receiving the IC package data, wherein the IC package data include one or more input parameters corresponding to at least one of:

integrated circuit parameters;

input/output parameters; or discrete symbols.

12. The method of claim 1, wherein the one or more first layers include at least one of a bump or a ball-grid array and wherein one or more transition layers of the printed circuit board design include the second layer.

13. The system of claim 10, wherein generating the one or more shapes corresponding to the one or more regions occupied by the one or more respective networks includes:

defining a spread radius;

merging overlapped boundaries of geometric shapes formed according to the spread radius; and creating the one or more shapes corresponding to the one or more regions according to the merged, overlapped boundaries.

14. The system of claim 13, wherein generating the one or more shapes corresponding to the one or more regions occupied by the one or more respective networks further includes prioritizing creation of the one or more shapes based on respective maximum distances of the one or more regions corresponding to the one or more shapes from a center of the IC package.

15. The system of claim 10, wherein the one or more first layers include a bump layer and a ball-grid array, and wherein generating the layout for the plurality of connections in the second layer of the printed circuit board design includes, for each respective network of the one or more networks of the IC package:

defining a respective region of the second layer corresponding to the respective network;

defining a plurality of vertical connections of the respective network between the bump layer and the respective region of the second layer; and defining a plurality of vertical connections of the respective network between the respective region of the second layer and the ball-grid array.

16. The system of claim 15, wherein defining the respective region of the second layer corresponding to the respective network includes determining whether a region of the ball-grid array above a portion of the second layer corresponds to the respective network or a region of the bump layer below the portion of the second layer corresponds to the respective network.

17. The system of claim 15, wherein the plurality of vertical connections of the bump layer to the second layer includes a plurality of stacked vias.

18. The system of claim 15, wherein defining the plurality of vertical connections of the second layer to the ball-grid array includes identifying a pattern of stacked vias based on a plurality of locations of a plurality of balls of the ball-grid array.

19. A non-transitory computer-readable medium comprising one or more computer-executable instructions that, when executed by at least one processor of a computing device, cause the computing device to perform operations including:

automatically generating, based on IC package data identifying one or more networks of an IC package, a printed circuit board design of a printed circuit board of the IC package, wherein automatically generating the printed circuit board design includes for each respective layer included in one or more first layers of the printed circuit board design, identifying, based on the IC package data, one or more regions of the respective layer occupied by one or more respective networks and generating one or more shapes corresponding to the one or more regions of the respective layer; and generating, based on the one or more shapes corresponding to the one or more regions of the one or more first layers, a layout for a plurality of connections in a second layer of the printed circuit board design.

20. The non-transitory computer-readable medium of claim 19, wherein the operations further include receiving the IC package data, wherein the IC package data include one or more input parameters corresponding to at least one of:

integrated circuit parameters;
input/output parameters; or
discrete symbols.

* * * * *